(12) United States Patent
Oh (10) Patent No.: US 7,135,997 B2
(45) Date of Patent: Nov. 14, 2006

(54) METHOD AND APPARATUS FOR CAVLC DECODING

(75) Inventor: Jun Hwan Oh, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 11/016,435

(22) Filed: Dec. 17, 2004

(65) Prior Publication Data
US 2005/0156761 A1   Jul. 21, 2005

(30) Foreign Application Priority Data
Dec. 18, 2003   (KR) .................. 10-2003-0093197

(51) Int. Cl.
*H03M 7/00*   (2006.01)
(52) U.S. Cl. .................. 341/106; 341/107; 341/67
(58) Field of Classification Search ................ 341/67, 341/79, 87, 95, 50, 51, 106, 107
See application file for complete search history.

(56) References Cited
U.S. PATENT DOCUMENTS

| | | | | |
|---|---|---|---|---|
| 5,623,423 A * | 4/1997 | Lipovski | .................. | 708/203 |
| 5,650,783 A * | 7/1997 | Murashita et al. | .......... | 341/107 |
| 5,860,136 A * | 1/1999 | Fenner | ........................ | 711/201 |
| 5,907,637 A * | 5/1999 | Murashita et al. | .......... | 382/239 |
| 6,504,496 B1 * | 1/2003 | Mesarovic et al. | ......... | 341/106 |
| 6,646,578 B1 * | 11/2003 | Au | ............... | 341/67 |
| 6,725,223 B1 * | 4/2004 | Abdo et al. | ................. | 707/100 |
| 6,903,669 B1 * | 6/2005 | Subramaniam | ............. | 341/106 |
| 6,919,826 B1 * | 7/2005 | Peacock | ....................... | 341/51 |
| 7,046,175 B1 * | 5/2006 | Subramaniam | ............. | 341/106 |
| 2003/0174076 A1 * | 9/2003 | Jang et al. | .................... | 341/65 |
| 2005/0135691 A1 * | 6/2005 | Reese | ........................ | 382/246 |

* cited by examiner

*Primary Examiner*—Linh Nguyen
(74) *Attorney, Agent, or Firm*—Lee, Hong, Degerman, Kang & Schmadeka (57) ABSTRACT

A CAVLC decoding method and apparatus is provided. In the method for decoding a coded bitstream using a CAVLC length table and a CAVLC value table, CAVLC length tables are re-sorted in an order of a codeword length and the coded bitstream is decoded using the re-sorted length table. Therefore, since data on a bitstream is sequentially read as much as a length suggested by the re-sorted table of the present invention, a memory access time is reduced and calculation complexity for comparing the CAVLC codewords is reduced.

29 Claims, 10 Drawing Sheets

| total_zeros | TotalCoeff( coeff_token ) | | | | | | | | | | |
|---|---|---|---|---|---|---|---|---|---|---|---|
| | 1 | 2 | 3 | 4 | 5 | 6 | 7 | ... | 13 | 14 | 15 |
| 0 | 1 | 111 | 0101 | 00011 | 0101 | 000001 | 000001 | ... | 000 | 00 | 0 |
| 1 | 011 | 110 | 111 | 111 | 0100 | 00001 | 00001 | ... | 001 | 01 | 1 |
| 2 | 010 | 101 | 110 | 0101 | 0011 | 111 | 101 | ... | 1 | 1 | |
| 3 | 0011 | 100 | 101 | 0100 | 111 | 110 | 100 | ... | 01 | | |
| 4 | 0010 | 011 | 0100 | 110 | 110 | 101 | 011 | ... | | | |
| 5 | 00011 | 0101 | 0011 | 101 | 101 | 100 | 11 | ... | | | |
| 6 | 00010 | 0100 | 100 | 100 | 100 | 011 | 010 | ... | | | |
| 7 | 000011 | 0011 | 011 | 0011 | 011 | 010 | 0001 | ... | | | |
| 8 | 000010 | 0010 | 0010 | 011 | 0010 | 0001 | 001 | | | | |
| 9 | 0000011 | 00011 | 00011 | 0010 | 00001 | 001 | 000000 | | | | |
| 10 | 0000010 | 00010 | 00010 | 00010 | 0001 | 000000 | | | | | |
| 11 | 00000011 | 000011 | 000001 | 00001 | 00000 | | | | | | |
| 12 | 00000010 | 000010 | 00001 | 00000 | | | | | | | |
| 13 | 000000011 | 000001 | 000000 | | | | | | | | |
| 14 | 000000010 | 000000 | | | | | | | | | |
| 15 | 000000001 | | | | | | | | | | |

Right side: 0
Left side: 1

FIG. 3

| TotalCoeff( coeff_token ) | | | | | | | | | | | | | | |
|---|---|---|---|---|---|---|---|---|---|---|---|---|---|---|
| 1 | 2 | 3 | 4 | 5 | 6 | 7 | 8 | 9 | 10 | 11 | 12 | 13 | 14 | 15 |
| 1 | 3 | 3 | 3 | 3 | 3 | 2 | 2 | 2 | 2 | 1 | 1 | 1 | 1 | 1 |
| 3 | 4 | 4 | 4 | 4 | 4 | 3 | 3 | 3 | 3 | 3 | 2 | 2 | 2 | |
| 4 | 5 | 5 | 5 | 5 | 5 | 4 | 4 | 4 | 4 | 4 | 3 | 3 | | |
| 5 | 6 | 6 | | | 6 | 5 | 5 | 5 | 5 | | 4 | | | |
| 6 | | | | | | 6 | 6 | 6 | | | | | | |
| 7 | | | | | | | | | | | | | | |
| 8 | | | | | | | | | | | | | | |
| 9 | | | | | | | | | | | | | | |

FIG. 4A

| TotalCoeff( coeff_token ) | | | | | | | | | | | | | | |
|---|---|---|---|---|---|---|---|---|---|---|---|---|---|---|
| 1 | 2 | 3 | 4 | 5 | 6 | 7 | 8 | 9 | 10 | 11 | 12 | 13 | 14 | 15 |
| 1 | 3 | 3 | 3 | 3 | 3 | 2 | 2 | 2 | 2 | 1 | 1 | 1 | 1 | 1 |
| 3 | 4 | 4 | 4 | 4 | 4 | 3 | 3 | 3 | 3 | 3 | 2 | 2 | 2 | |
| 4 | 5 | 5 | 5 | 5 | 5 | 4 | 4 | 4 | 4 | 4 | 3 | 3 | | |
| 5 | 6 | 6 | | | 6 | 5 | 5 | 5 | 5 | | 4 | | | |
| 6 | | | | . | | 6 | 6 | 6 | | | | | | |
| 7 | | | | | | | | | | | | | | |
| 8 | | | | | | | | | | | | | | |
| 9 | | | | | | | | | | | | | | |

FIG. 4B

| TotalCoeff(coeff_token) | | | | | |
|---|---|---|---|---|---|
| 1 | 2 | 3 | | | |
| 1 | 1 | 1 | | | |
| 2 | 2 | | | | |
| 3 | | | | | |

FIG. 4C

| | zerosLeft | | | | | |
|---|---|---|---|---|---|---|
| 1 | 2 | 3 | 4 | 5 | 6 | >6 |
| 1 | 1 | 2 | 2 | 2 | 2 | 3 |
|   | 2 |   | 3 | 3 | 3 | 4 |
|   |   |   |   |   |   | 5 |
|   |   |   |   |   |   | 6 |
|   |   |   |   |   |   | 7 |
|   |   |   |   |   |   | 8 |
|   |   |   |   |   |   | 9 |
|   |   |   |   |   |   | 10 |
|   |   |   |   |   |   | 11 |

FIG. 4D

| 0<=nC<2 | 2<=nC<4 | 4<=nC<8 |
|---|---|---|
| 1 | 2 | 4 |
| 2 | 3 | 5 |
| 3 | 4 | 6 |
| 5 | 5 | 7 |
| 6 | 6 | 8 |
| 7 | 7 | 9 |
| 8 | 8 | 10 |
| 9 | 9 |   |
| 10 | 11 |   |
| 11 | 12 |   |
| 13 | 13 |   |
| 14 | 14 |   |
| 15 |   |   |
| 16 |   |   |

| total_zeros | TotalCoeff( coeff_token ) | | | | | | | | | | | | | | |
|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 |
| 0 | 1 | 3 | 4 | 5 | 4 | 6 | 6 | 6 | 6 | 5 | 4 | 4 | 3 | 2 | 1 |
| 1 | 3 | 3 | 3 | 3 | 4 | 5 | 5 | 4 | 6 | 5 | 4 | 4 | 3 | 2 | 1 |
| 2 | 3 | 3 | 3 | 4 | 4 | 3 | 3 | 5 | 4 | 3 | 3 | 2 | 1 | 1 | |
| 3 | 4 | 3 | 3 | 4 | 3 | 3 | 3 | 3 | 2 | 2 | 3 | 1 | 2 | | |
| 4 | 4 | 3 | 4 | 3 | 3 | 3 | 3 | 2 | 2 | 2 | 1 | 3 | | | |
| 5 | 5 | 4 | 4 | 3 | 3 | 3 | 2 | 2 | 3 | 2 | 3 | | | | |
| 6 | 5 | 4 | 3 | 3 | 3 | 3 | 3 | 3 | 2 | 4 | | | | | |
| 7 | 6 | 4 | 3 | 4 | 3 | 3 | 4 | 3 | 5 | | | | | | |
| 8 | 6 | 4 | 4 | 3 | 4 | 4 | 3 | 6 | | | | | | | |
| 9 | 7 | 5 | 5 | 4 | 5 | 3 | 6 | | | | | | | | |
| 10 | 7 | 5 | 5 | 5 | 4 | 6 | | | | | | | | | |
| 11 | 8 | 6 | 6 | 5 | 5 | | | | | | | | | | |
| 12 | 8 | 6 | 5 | 5 | | | | | | | | | | | |
| 13 | 9 | 6 | 6 | | | | | | | | | | | | |
| 14 | 9 | 6 | | | | | | | | | | | | | |
| 15 | 9 | | | | | | | | | | | | | | |

FIG. 6

| total_zeros | TotalCoeff( coeff_token ) | | | | | | | | | | | | | | |
|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 |
| 0 | 1 | 7 | 5 | 3 | 5 | 1 | 1 | 1 | 1 | 1 | 0 | 0 | 0 | 0 | 0 |
| 1 | 3 | 6 | 7 | 7 | 4 | 1 | 1 | 1 | 0 | 0 | 1 | 1 | 1 | 1 | 1 |
| 2 | 2 | 5 | 6 | 5 | 3 | 7 | 5 | 1 | 1 | 1 | 1 | 1 | 1 | 1 | |
| 3 | 3 | 4 | 5 | 4 | 7 | 6 | 4 | 3 | 3 | 3 | 2 | 1 | 1 | | |
| 4 | 2 | 3 | 4 | 6 | 6 | 5 | 3 | 3 | 2 | 2 | 1 | 1 | | | |
| 5 | 3 | 5 | 3 | 5 | 5 | 4 | 3 | 2 | 1 | 1 | 3 | | | | |
| 6 | 2 | 4 | 4 | 4 | 4 | 3 | 2 | 2 | 1 | 1 | | | | | |
| 7 | 3 | 3 | 3 | 3 | 3 | 2 | 1 | 1 | 1 | | | | | | |
| 8 | 2 | 2 | 2 | 3 | 2 | 1 | 1 | 0 | | | | | | | |
| 9 | 3 | 3 | 3 | 2 | 1 | 1 | 0 | | | | | | | | |
| 10 | 2 | 2 | 2 | 2 | 1 | 0 | | | | | | | | | |
| 11 | 3 | 3 | 1 | 1 | 0 | | | | | | | | | | |
| 12 | 2 | 2 | 1 | 0 | | | | | | | | | | | |
| 13 | 3 | 1 | 0 | | | | | | | | | | | | |
| 14 | 2 | 0 | | | | | | | | | | | | | |
| 15 | 1 | | | | | | | | | | | | | | |

METHOD AND APPARATUS FOR CAVLC DECODING

This application claims the benefit of the Korean Application No. 10-2003-0093197 filed on Dec. 18, 2003, which is hereby incorporated by reference.

BACKGROUND OF THE INVENTION

1. Field of the Invention

The present invention relates to a variable length decoding of H.264/Advanced Video Coding (AVC) video decoder, and more particularly, to a method for referring fast a context-based adaptive variable length coding (CAVLC) table prescribed by a H.264/AVC standard.

2. Discussion of the Related Art

A digital multimedia broadcasting (DMB) video standard conforms to a H.264/AVC standard.

The video standard relates to a video bitstream syntax and a decoder. The DMB video decoder according to this standard uses two variable length coding types for efficient data bit assignment.

According to this standard, a Universal Variable Length Coding (UVLC) type is used for data except transformed coefficients of video data and a CAVLC type is used for transformed coefficients of video data.

The variable length coding type is a coding type for assigning the number of bits having a different length to a symbol of each signal depending on statistical characteristics of signal generation frequency using statistical characteristics of a signal. The variable length coding type is constantly used in a related art video compression method.

The CAVLC type prescribed by the H.264/AVC standard adopts a method for decoding a signal using a table that corresponds to variables such as TotalCoeff, TrailingOnes, total_zero, run_before depending on transformed coefficient characteristics of video data.

A related art method for performing the variable length decoding uses a method for reading a code that corresponds to a code length defined by the variable length decoding table from a bitstream to compare the code with a code of the variable length decoding table.

For the worst case, all code values of the table should be compared in order to apply this method, thus a process for accessing a bitstream memory in succession is required. Therefore, there has been a problem that a process speed of the decoder is lowered due to the above-described inefficient process.

SUMMARY OF THE INVENTION

Accordingly, the present invention is directed to a method and an apparatus for CAVLC decoding that substantially obviate one or more problems due to limitations and disadvantages of the related art.

An object of the present invention is to provide a method and an apparatus for solving calculation complexity in a method for referring the CAVLC table in all systems that apply a video decoding type prescribed by the H.264/AVC standard.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a CAVLC decoding method for decoding a coded bitstream using CAVLC length tables and CAVLC value tables, the method including the steps of: re-sorting the CAVLC length tables in an order of a codeword length; and decoding the coded bitstream using the re-sorted length tables.

The step of re-sorting the order of the codeword length is performed using a binary tree.

The step of re-sorting the order of the codeword length is so performed as to compare a codeword length last if the codeword length consisting of zero within the same column of the CAVLC length table is not a lowermost level of the binary tree.

The step of re-sorting the order of the codeword length is performed in such an order that a short codeword length is sorted first, namely, a codeword length having a high possibility of generation is sorted first.

The step of decoding the coded bitstream includes the steps of: selecting a table that corresponds to a variable desired to be decoded among the re-sorted tables; reading the bitstream as much as the codeword length sequentially starting from a first codeword length in a reference column within the selected table; comparing a value of the read bitstream with a value on the CAVLC value table, held by a codeword length that coincides with the read codeword length in a column that coincides with the reference column within the CAVLC length table; if the value of the bitstream value coincides with the value on the CAVLC value table as a result of the comparison, storing a variable value at that point.

The reference column is a column selected from information included in a header portion of a packet enclosing the bitstream and information of a decoded adjacent block.

In another aspect of the present invention, there is provided a CAVLC decoding method for decoding a coded bitstream using CAVLC length tables and CAVLC value tables, the method which includes the steps of: selecting a table that corresponds to a variable desired to be decoded among tables in which the CAVLC length tables set and inputted in advance are re-sorted; reading the bitstream as much as the codeword length sequentially starting from a first codeword length in a reference column within the selected table; comparing a value of the read bitstream value with a value on the CAVLC value table, held by a codeword length that coincides with the read codeword length in a column that coincides with the reference column within the CAVLC length table; if the value of the bitstream coincides with the value on the CAVLC value table as a result of the comparison, storing a variable value at that point.

In a further another aspect of the present invention, there is provided a CAVLC decoding apparatus for decoding a coded bitstream using CAVLC length tables and CAVLC value tables, the apparatus including: a memory in which the CAVLC length tables and the CAVLC value tables are stored; a memory in which the CAVLC length tables are re-sorted and stored; and a CAVLC parser for receiving the bitstream to parse relevant variables using the re-sorted length table, the CAVLC length table, and the CAVLC value table.

The apparatus further includes a stream controller for delivering an input bitstream to the CAVLC parser according to an sorted order in the re-sorted table.

The re-sorted tables are obtained by re-sorting the CAVLC length tables according to a codeword length order.

Therefore, since the present invention sequentially reads data on the bitstream as much as a length suggested by the re-sorted table, a memory access time is reduced and a calculation complexity in comparing the CAVLC codewords is reduced.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings.

Though a general terminology widely and currently used has been adopted in describing the present invention, a terminology arbitrarily selected by the applicant has been used for a certain case. In that case, the specific meaning thereof is explained in the relevant part of the detailed description of the invention. Accordingly, the present invention should not be understood by the simple denotation of the terminology but by the meaning conveyed by the terminology.

The basic concept of the VLC method used in the present invention is to reduce a bit assignment length of an average encoding signal in encoding a generated signal by assigning the small number of bits for a symbol of a signal having a large statistical characteristics and assigning the large number of bits for a symbol of a signal having a small statistical characteristics depending on statistical characteristics of data generation.

A basic principle of the method is briefly explained by a Huffinan method. Since processes for performing the encoding and the decoding are similar to a binary tree structure in some sense, the present invention suggests a search method using the binary tree structure.

Figure 1:
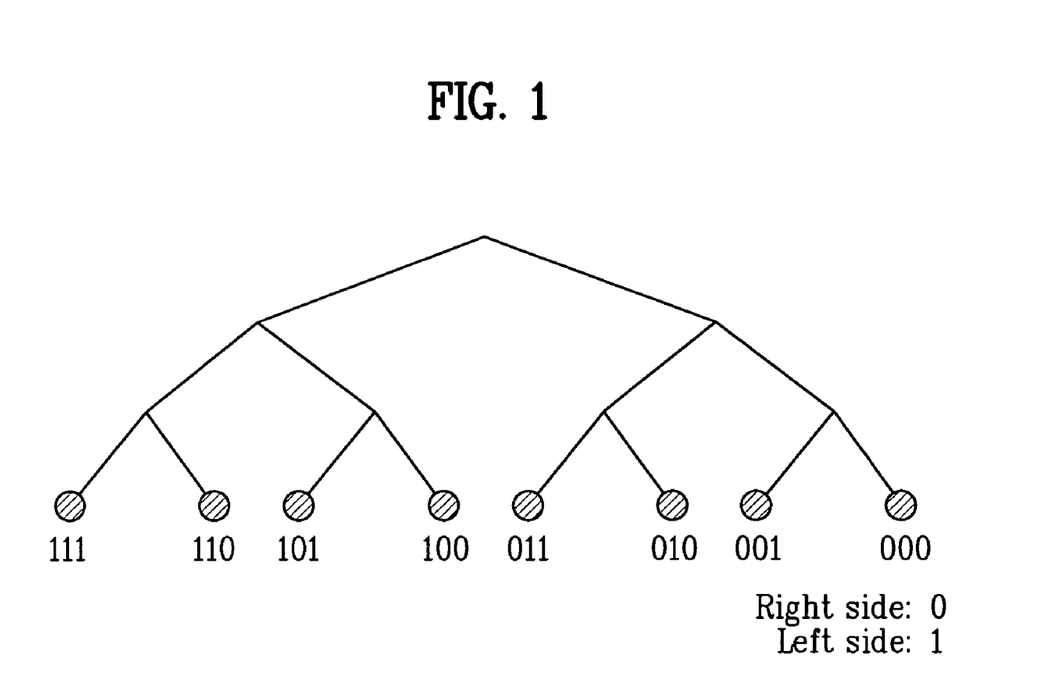
FIG. 1 is a view illustrating a general binary search tree.

FIG. 1 is a view illustrating a binary search tree structure for explaining a basic principle of the present invention.

Referring to FIG. 1, the binary search tree has a symmetric structure, a parent has two offsprings (parent: higher node, offspring: sub-node), and '1', '0' are assigned to a left branch and a right branch, respectively.

N values are compared using the binary search tree, which can be processed with a calculation complexity of $log_2 N$ steps. The above method is an algorithm for performing fast searching using a hierarchical data structure but there is a disadvantage that a complicated process of newly organizing the binary search tree every time is required.

However, if the above comparison is processed using a length unit of a CAVLC code table prescribed by the video decoder, a table having a hierarchical structure similar to the above structure can be easily obtained.

Therefore, according to the present invention, for employment of the variable length decoding method, the CAVLC code table having a hierarchical structure is easily organized and referred. Accordingly, the present invention improves a process speed and a load of the decoder by searching fast an estimated code, getting out of the related art method for searching all the number of cases in order to compare the CAVLC code tables. The process will be described in detail with reference to the accompanying drawings in the following.

Figure 2:
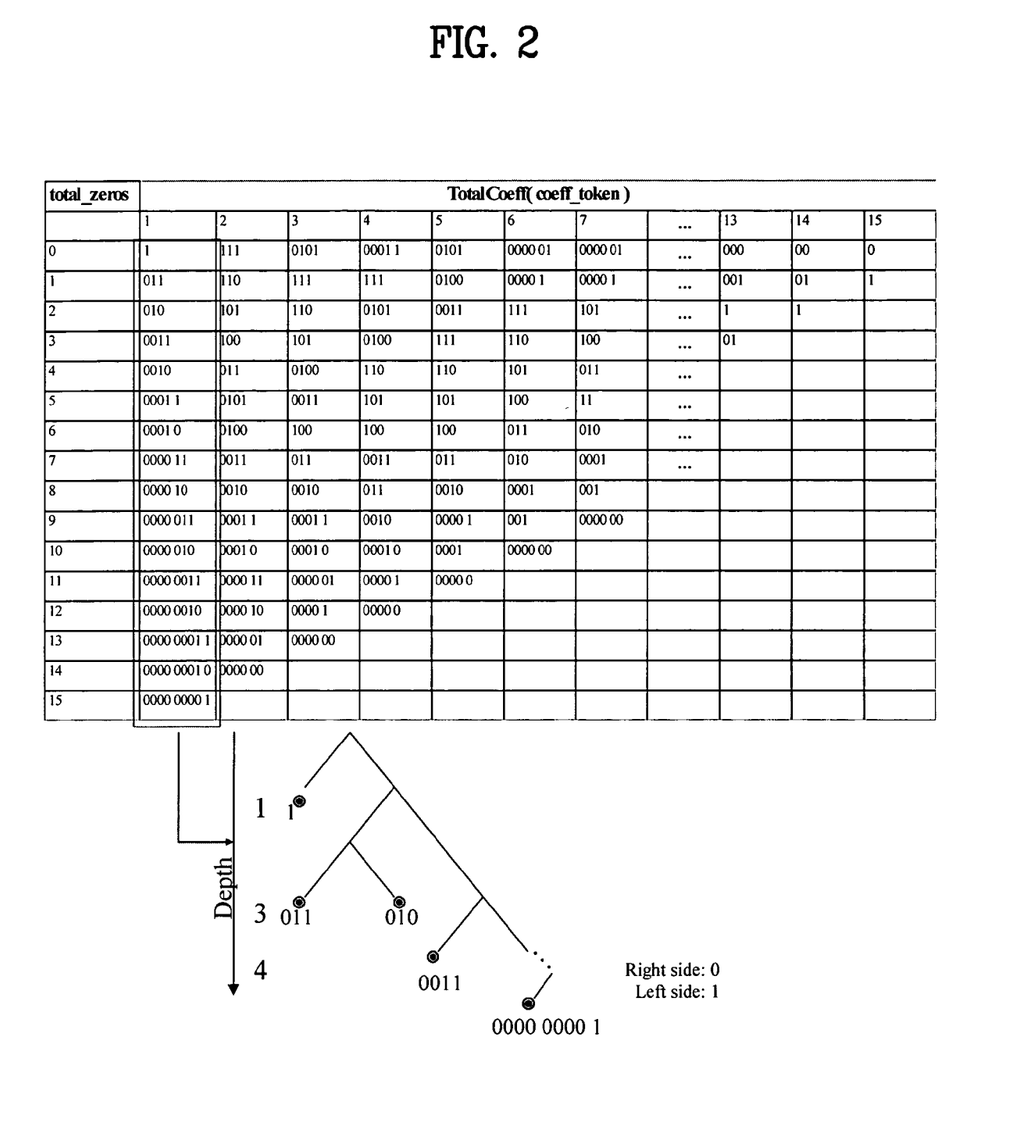
FIG. 2 is a view illustrating a CAVLC table representing Total_Zeros including Total_Coeff and a binary tree structure thereof according to the present invention.

FIG. 2 is a view illustrating a CAVLC table and a binary tree structure thereof according to the present invention.

Particularly, a table of FIG. 2 exemplifies a Total_Zeros table including Total_Coeff among the CAVLC tables, in which a first column is converted into a binary tree structure.

A horizontal axis of the table represents Total_Coeff (coeff_token), namely, the number of coefficients having a value of non-zero among variable length coded coefficients and a vertical axis of the table represents total_zero, namely, the number of coefficients having a value of zero among the variable length coded coefficients. Codeword values are represented on an inner region formed by the horizontal axis and the vertical axis. The codeword values conform to the H.264/AVC CAVLC standard.

Referring to FIG. 2, the expressed codeword value is converted into a binary tree from a first column of the table. In the same way as used in the binary tree mentioned above, '1' is assigned to the left branch and '0' is assigned to the right branch.

That is, '1' expressed by 1 bit which is the first codeword value of the table is expressed as a left branch of the first level in the binary tree. A right branch is not expressed, for a codeword whose value is zero expressed by 1 bit does not exist in the CAVLC codeword table. Next to that, there exist 3-bit values, thus the right branch is extended to assign values of a third level, respectively.

In this manner, a longest code is assigned to a last branch and a codeword whose value is '0' is assigned to an end branch at the right. In FIG. 2, since a cord word whose value is zero does not exist among the codewords on the table that corresponds to the binary tree, a last branch at the right remains vacant.

In this manner, if codewords of other table are converted into the binary tree in the same manner as described above, the CAVLC table can be seen in a hierarchical structure and the codewords can be sorted in such an order that a codeword length having a high possibility of generation is sorted first.

Namely, as described above, since a bit having a short length is assigned to a signal having a high possibility of generation in viewpoint of the VLC algorithm, the codewords are sorted in such an order that a codeword length having a high possibility of generation (having a short codeword length) is sorted first.

Further, a depth of the binary tree has a close relation to a calculation complexity of searching values. That is, as the depth of the binary tree becomes deep and the structure of the binary tree becomes asymmetric, the calculation complexity of searching is increased.

As described above, each cord word should be assigned to a depth (level) of the binary tree to organize the binary tree, and the level in the binary tree of each codeword is associated with a codeword length.

Figure 3:
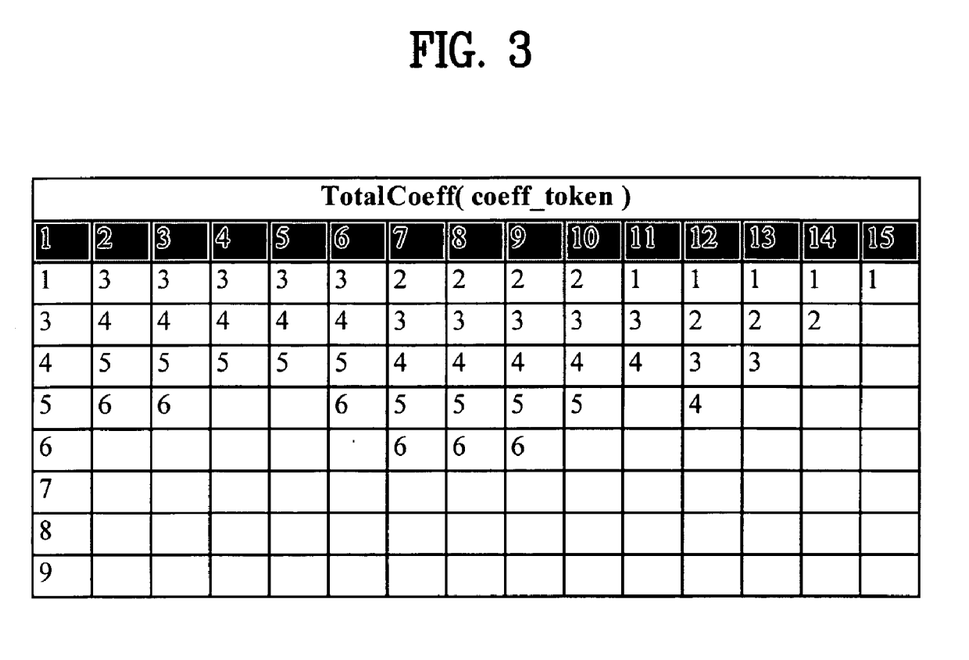
FIG. 3 is a view illustrating a CAVLC codeword length table representing Total_Zeros including Total_Coeff re-sorted according to the present invention.

Therefore, in association with easy organization of the binary tree, a table for sorting codeword lengths of each table needs to be newly organized in order to construct and compare the codewords using the codeword length for a reference, which is illustrated in FIG. 3.

FIG. 3 is a view illustrating a Total_Zero table including Total_Coeff of the CAVLC re-sorted depending on the codeword length.

Referring to FIG. 3, the newly organized table re-sorts the codewords in a codeword length order in which a codeword length having a high possibility of generation is sorted first. At this point, if a codeword length consisting of zero does not have a longest length within the same column of the CAVLC table, namely, the code is not assigned to a lowermost level of the binary tree, sorting is made so that the code is compared last, which is illustrated in FIGS. 4A through 4E.

Figure 4A:
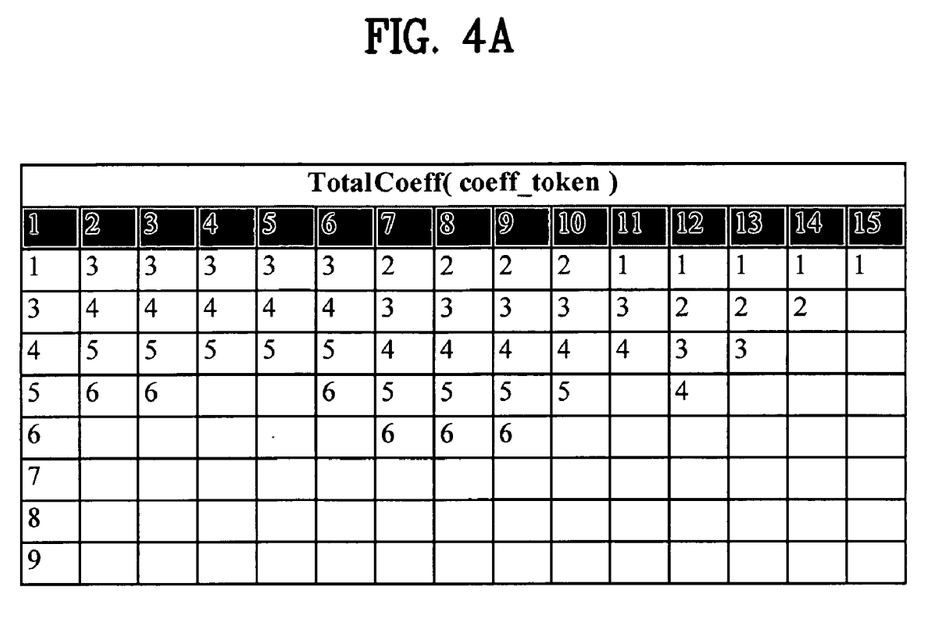
FIGS. 4A and 4E are views illustrating a codeword length table of each CAVLC variable for use in H.264/AVC re-sorted according to the present invention.
Figure 4B:
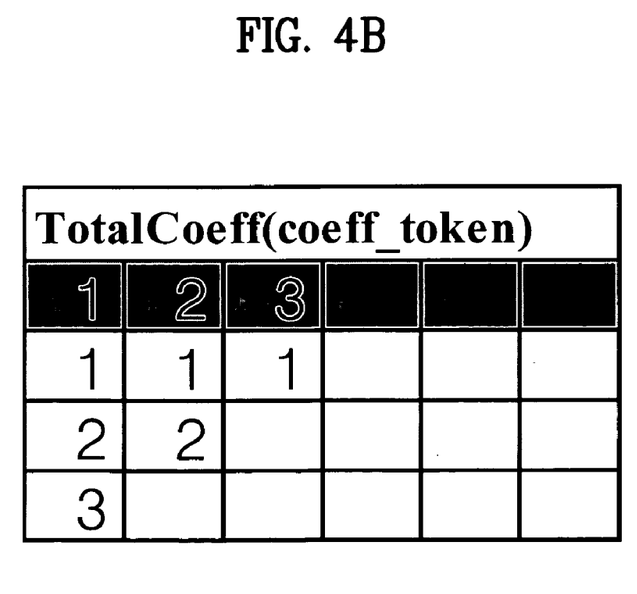
Figure 4C:
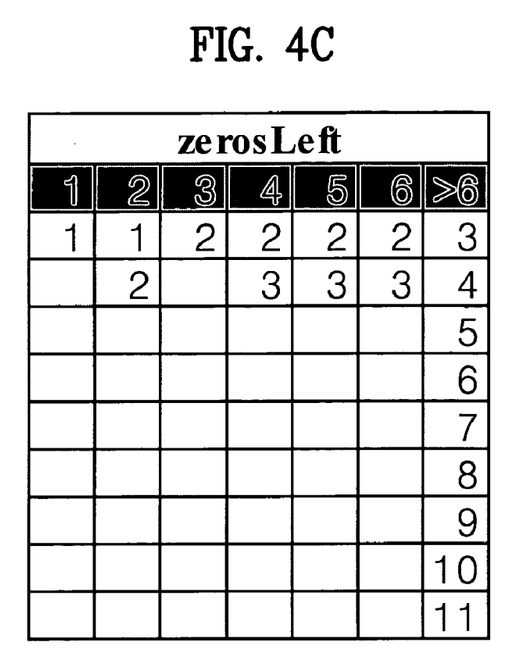
Figure 4D:
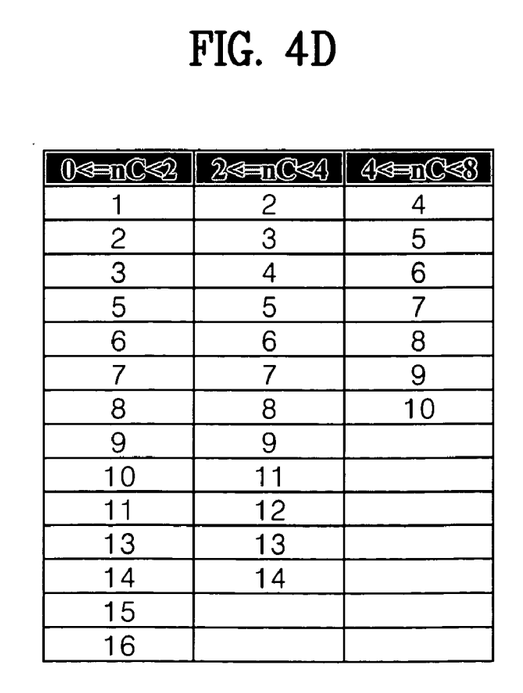
Figure 4E:
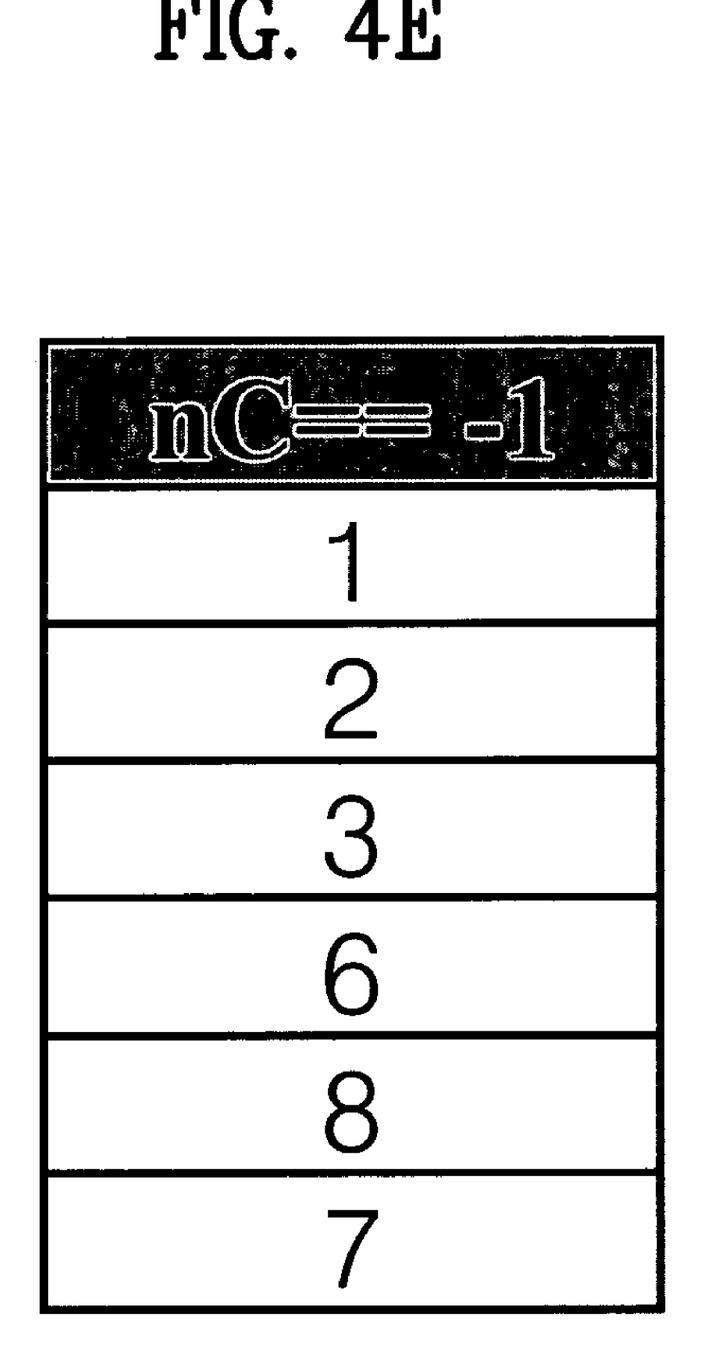

That is, FIG. 4A is a view illustrating a Total_Zeros including Total_Coeff for a 4×4 block, FIG. 4B is a view illustrating a Total_Zeros including Total_Coeff for a Chroma DC, FIG. 4C is a view illustrating a run_before variable of the CAVLC, FIG. 4D is a view illustrating a Total_Coeff and TrailingOnes variables, and FIG. 4E is a view illustrating a Total_Coeff and TrailingOnes variables for a Chroma re-sorted depending on the codeword length, respectively.

At this point, since the codewords whose lengths are seven are constructed by all zero (0000 000) in case of FIG. 4E, the code is sorted so as to be compared later than two cases of '0000 0011', '0000 0010' whose codeword lengths is eight in the table.

That is, as described above, the above case is the case that a length of a codeword length consisting of zero does not have a longest length within the same column of the CAVLC table, sorting has been made so that the code is compared last.

Since a codeword that corresponds to a next length is compared if zero successively comes in view of an algorithm which will be described below, a codeword length order with which comparison for finding out the codeword of '0000 000' is performed is changed.

The tables that correspond to each CAVLC variable under the H.264/AVC standard are re-sorted and utilized in a decoding process, so that a process for reading a bit is not performed doubly and the comparison is sequentially performed in such an order that a codeword length having a high possibility of generation is sorted first. The above decoding process will be described below with reference to the accompanying drawings.

Figure 5:
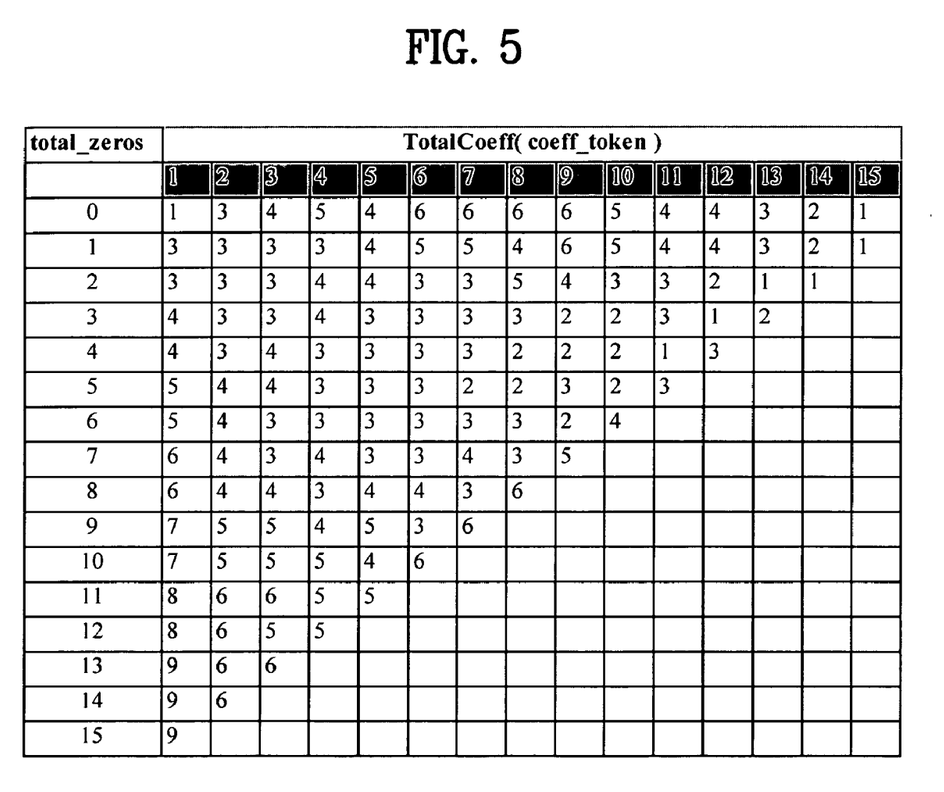
FIG. 5 is a view illustrating a CAVLC codeword length table of total_zeros including Total_Coeff conforming to H.264/AVC standard for explaining a CAVLC decoding method according to the present invention.
Figure 6:
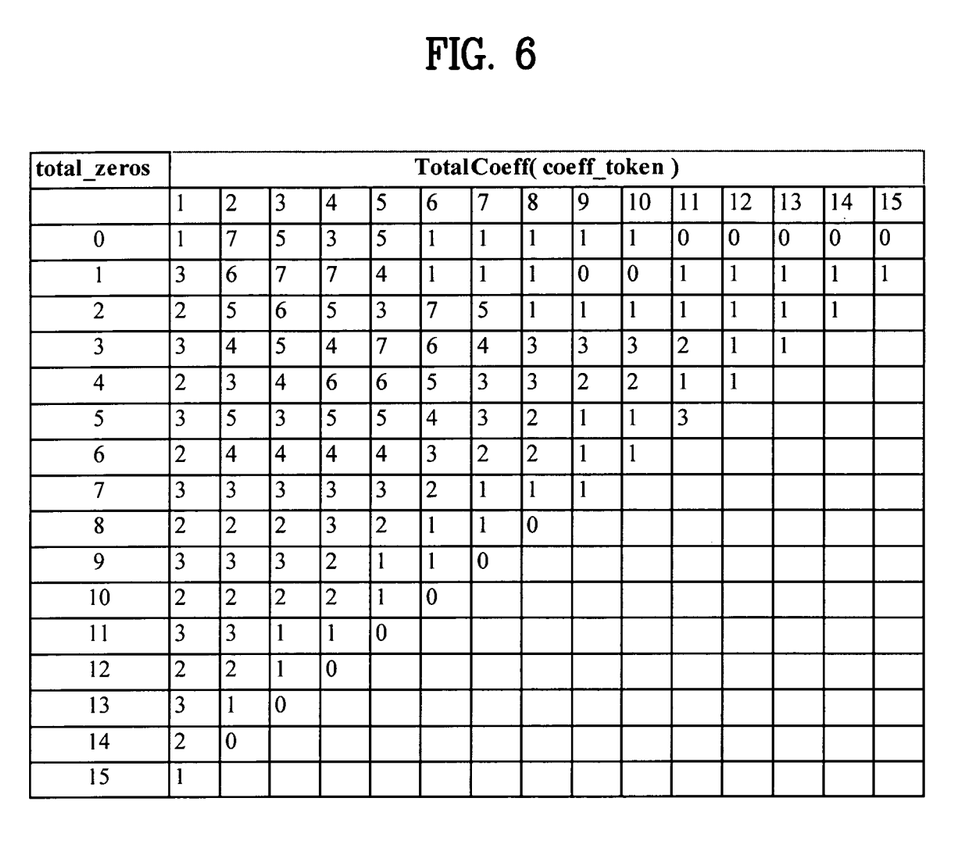
FIG. 6 is a view illustrating a CAVLC codeword value table of total_zeros including Total_Coeff conforming to H.264/AVC standard for explaining a CAVLC decoding method according to the present invention.

FIGS. 5 and 6 are tables opened under the H.264/AVC CAVLC standard. FIG. 5 is a view illustrating a CAVLC table of a Total_zeros including a Total_Coeff according to a CAVLC codeword length, and FIG. 6 is a view exemplarily illustrating a CAVLC table of a Total_zeros including a Total_Coeff according to a CAVLC codeword value.

That is, in general, when decoding coded data using a CAVLC method, information regarding which column of the CAVLC table is referred is obtained through information included in a header of a transmitted packet and information of decoded adjacent block first. Then, a bitstream (data of transmitted packet) is read as much as a relevant length sequentially starting from a first value of a relevant column in a table representing a codeword length from a memory as illustrated in FIG. 5.

If a codeword value that corresponds to the read value is compared with a codeword value of the table of FIG. 6 and the values are the same as a result of the comparison, a Total_Coeff value and a total_zero value at that point are obtained and the same method is applied to other variables to obtain values thereof, whereby decoding is performed.

However, at this point, it is known that codeword lengths within a table under the general CAVLC standard are not sorted in a constant order as illustrated in FIG. 5. Accordingly, already read bit is often read again, which is very inefficient.

Therefore, by using the table of FIG. 3 according to the present invention, a process for reading a bit is not performed doubly and the comparison is sequentially performed starting from a codeword length having a high possibility of generation. The process will be described below with reference to FIG. 7 which is a flowchart illustrating a CAVLC decoding process according to the present invention. (for convenience in explanation, a total_zeros variable such that a bitstream inputted to the memory starts from 0101011 . . . and which includes a Total_Coeff of FIGS. 3, 5, and 6 will be taken as an example. Further, it is assumed that information included in the packet header and information of a decoded adjacent block indicate to refer a first column of the CAVLC table).

Figure 7:
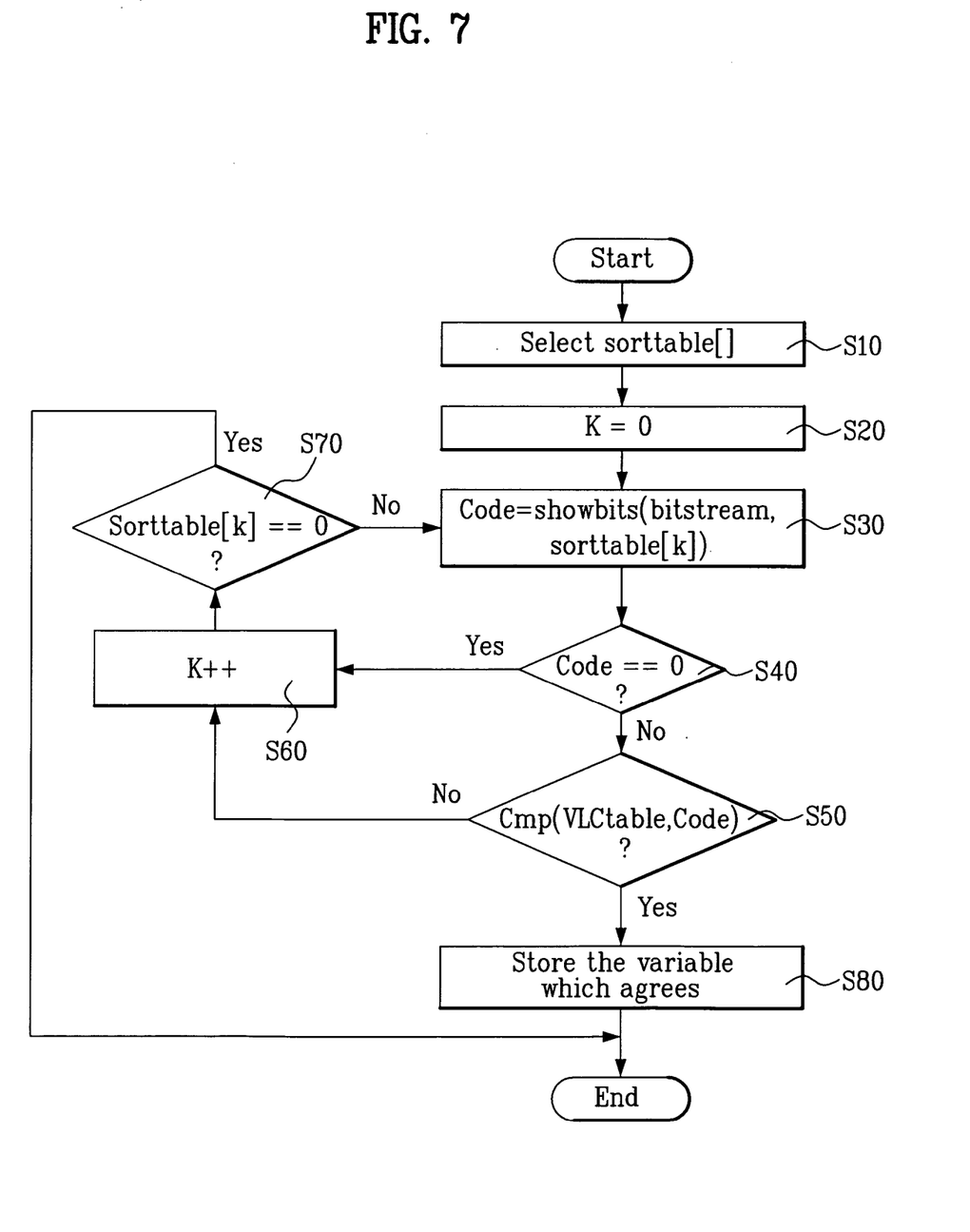
FIG. 7 is a flowchart illustrating a CAVLC decoding process according to the present invention.

First, a table that corresponds to a variable desired to decode is selected among re-sorted tables (S10). Since a total_zeros variable including Total_Coeff has been taken as an example in the present invention, the table of FIG. 3 is selected.

A bitstream is read as much as K=0, i.e., a length that corresponds to a first value in the selected table (S20 and S30). That is, since the first value of the first column in FIG. 3 is '1', the bitstream is read as much as 1-bit length, so that zero is read from the exemplified bitstream.

If whether the read value is zero is checked (S40). If the value is zero, a K value is increased one unit (S60). If the value is not zero, the K value is compared with a code value of the CAVLC table (S50).

In the above case, since the read value is zero, the K value is increased one unit. At this point, if the codeword value of the table that corresponds to the increased K value is zero, the process is terminated. If the codeword value is not zero, the step S30 is performed (S70). That is, a block where a number is not mentioned in the table of FIG. 3 is zero, which means there does not exist a codeword to read any more, so that the process is terminated.

Therefore, in the exemplified case, since the value on the table of FIG. 3 that corresponds to the increased K value is three (not zero, so that the process is not terminated), the bitstream is read as much as a 3-bit length (S30).

The read value is 010, which is not zero, and it is compared with a value on the CAVLC table (S50). At this point, according to the table of FIG. 5, the case that a codeword length is three includes two cases of the total_zeros=1 and 2.

First, since a codeword value is three when checked through the table of FIG. 6 in case of the total_zeros=1, it is known that 'three' does not coincide with the value 'two' that corresponds to a binary number 010 read from the bitstream (the binary number 010 is 2 when converted into a decimal number).

In case of the total_zeros=2, a codeword value on the table of FIG. 6 is 2, which coincides with the value 2 of 010 read from the bitstream.

Therefore, the Total_Coeff value and the total_zeros value at this point are stored (S80) and the process is terminated, so that a next decoding process is performed.

For more careful understanding of an efficiency of the CAVLC decoding method of the present invention which uses the above described method, a total_zeros variable such that a bitstream inputted to the memory starts from 110101 . . . and which includes a Total_Coeff of FIGS. 3, 5, and 6 will be taken as an example at this time with assumption that information included in the packet header and information of a decoded adjacent block indicate to refer a fourth column of the CAVLC table.

Initially, it is known that a first value of the fourth column is three through the table of FIG. 3. Therefore, the case that a codeword length is three in the fourth column on the table of FIG. 5 includes the cases of the total_zeros=1,4,5,6, and 8.

First, since a codeword value is seven when checked through the table of FIG. 6 in case of the total_zeros=1, it is known that 'seven' does not coincide with the value 'six' which corresponds to a binary number 110 read as much as the codeword length 'three' from the bitstream.

On the contrary, since a codeword value is six when checked through the table of FIG. 6 in case of the total_zeros=1, it is known that 'six' coincides with the binary number 110 read as much as the codeword length 'three' from the bitstream. The variable values are stored and a next decoding step is performed.

If the value had been searched using a related art method, at least more than five times of comparison processes have been required. On the contrary, according to the present invention, a desired value can be obtained through only two times of comparison processes.

Figure 8:
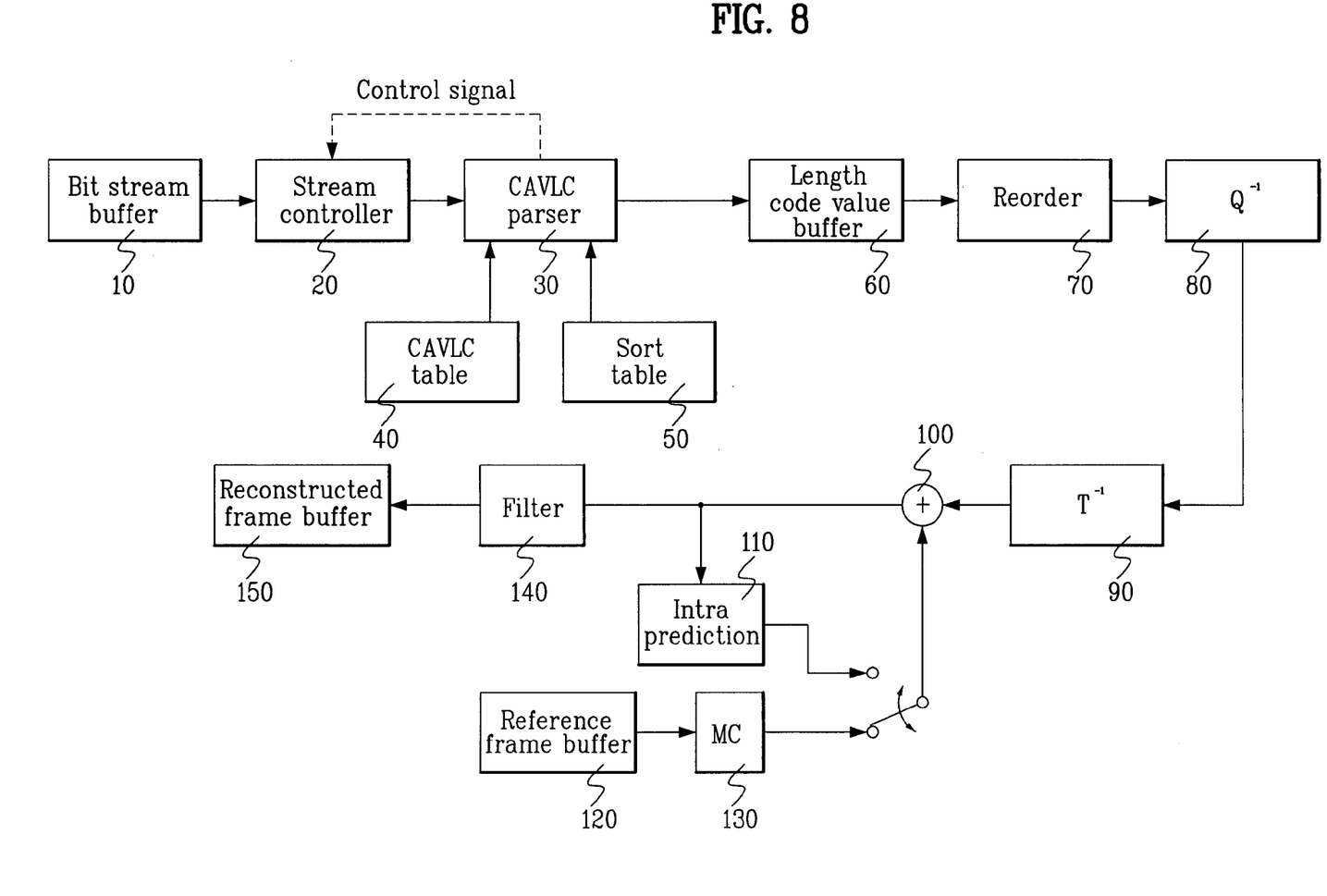
FIG. 8 is a block diagram schematically illustrating an inner construction of a CAVLC decoder according to the present invention.

In the meantime, FIG. 8 is a block diagram briefly illustrating an inner construction of the CAVLC decoder to which a spirit of the present invention is applied.

Referring to FIG. 8, an initially CAVLC coded and transmitted bitstream is stored in a bitstream buffer 10. After that, when a CAVLC parser 30 at a rear requests a necessary bit length value using a control signal, a stream controller 20 delivers the bitstream as much as a relevant length to the CAVLC parser 30 through the bitstream buffer 10.

The CAVLC parser 30 determines a relevant CAVLC table using tables stored in a CAVLC table 40 and a sort table 50 and performs comparisons using the method of the present invention by referring to re-sorted tables. That is, the above-mentioned CAVLC length and value tables are stored in the CAVLC table 40 and tables re-sorted using the binary tree of the present invention are stored in the sort table 50.

Therefore, the CAVLC parser 30 determines a comparison priority by referring to the re-sorted tables stored in the sort table 50, thereby efficiently performing the CAVLC parsing.

The variables of the CAVLC lengths and values which are the parsing results are stored in a relevant buffer (length, code value buffer) 60 and inverse-zigzag scanned by a re-order element 70.

The bitstream inverse-zigzag scanned and re-ordered is inverse-quantized at an element 80 and inverse-transformed at an element 90 to be outputted to an adder 100. The adder 100 adds a result predicted within one frame by an intra prediction 110 and a motion-compensated result of a previous frame to the inverse-transformed result and outputs the added result to a filter 140. The result filtered by the filter 140 is stored in a reconstructed frame buffer 150, so that a CAVLC decoding is performed.

In the meantime, the present invention can be applied to all systems that apply the video decoding method prescribed by the H.264/AVC standard.

As described above, the CAVLC decoding method and apparatus according to the present invention has the following effects.

First, since data on a bitstream is sequentially read as much as a length suggested by the re-sorted table of the present invention, a memory access time is reduced.

Second, since the data on the bitstream is compared with a value on the codeword table that corresponds to a length on the re-sorted table of the present invention, a comparison process amount is reduced.

Third, when the method of the present invention is used for a decoding process in application fields of DMB systems, simplification of a decoder is achieved and a processing speed is improved.

Fourth, the present invention can be applied to all application fields that conform to the H.264/AVC standard.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A CAVLC (context-based adaptive variable length coding) decoding method for decoding a coded bitstream using CAVLC length tables and CAVLC value tables, the method comprising the steps of:
   re-sorting the CAVLC Length tables in an order of a codeword length; and
   decoding the coded bitstream using the re-sorted length tables;
   wherein the step of re-sorting the CAVLC length tables is performed for each table of CAVLC variables, and each table comprises a Total_Zeros variable table including a Total_Coeff, a Total_Zeros variable table including a Total_Coeff for a Chroma DC, a run_before variable table of a CAVLC, a Total_Coeff and TrailingOnes variable tables, a Total_Coeff for a Chroma and TrailingOnes variable tables.

2. The method of claim 1, wherein the step of re-sorting the CAVLC length tables uses a binary tree.

3. The method of claim 2, wherein the binary tree has a symmetric structure and has '1' assigned to its left branch and '0' assigned to its right branch.

4. The method of claim 2, wherein the step of re-sorting is so performed as to compare a codeword length last if the codeword length consisting of zero within the same column of the CAVLC length table is not a lowermost level of the binary tree.

5. The method of claim 1, wherein the step of re-sorting the CAVLC length tables in the order of the codeword length is performed in such an order that a short codeword length is sorted first, namely, a codeword length having a high possibility of generation is sorted first.

6. The method of claim 1, wherein the step of decoding the coded bitstream comprises the steps of
   selecting a table that corresponds to a variable desired to be decoded among the re-sorted tables;
   reading the bitstream as much as the codeword length sequentially starting from a first codeword length in a reference column within the selected table;
   comparing a value of the read bitstream with a value on the CAVLC value table, held by a codeword length that coincides with the read codeword length in a column that coincides with the reference column within the CAVLC length table; and
   if the value of the bitstream value coincides with the value on the CAVLC value table as a result of the comparison, storing a variable value at that point.

7. The method of claim 6, wherein the reference column is a column selected from information included in a header part of a packet enclosing the bitstream and information of a decoded adjacent block.

8. The method of claim 6, wherein if the read bitstream value is zero, the bitstream is read as much as a codeword length that corresponds to a value next to a value compared in the reference column on the re-sorted table.

9. The method of claim 8, wherein if a codeword value that corresponds to a codeword length for the next value is zero, a process is terminated.

10. The method of claim 6, wherein if the bitstream value does not coincide with the value on the CAVLC value table as a result of the comparison, the bitstream is read as much as a codeword length that corresponds to a value next to a value compared in the reference column on the re-sorted table.

11. A CAVLC (context-based adaptive variable length coding) decoding method for decoding a coded bitstream using CAVLC length tables and CAVLC value tables, the method comprising the steps of:
   selecting a table that corresponds to a variable desired to be decoded among tables in which the CAVLC length tables set and inputted in advance are re-sorted based on an order of a codeword length;
   reading the bitstream as much as the codeword length sequentially starting from a first codeword length in a reference column within the selected table;
   comparing the read bitstream value with a value on the CAVLC value table, held by a codeword length that coincides with the read codeword length in a column that coincides with the reference column within the CAVLC length table; and
   if the bitstream value coincides with the value on the CAVLC value table as a result of the comparison, storing a variable value at that point;
   wherein the CAVLC length table comprises a Total_Zeros variable table including a Total_Coeff, a Total_Zeros variable table including a Total_Coeff for a Chroma DC, a run_before variable table of a CAVLC, a Total_Coeff and TrailingOnes variable tables, a Total_Coeff for a Chroma and TrailingOnes variable tables.

12. The method of claim 11, wherein the re-sorted table is a table organized by re-sorting the CAVLC codeword length tables in an order of the codeword length.

13. The method of claim 12, wherein the re-sorting of the CAVLC codeword length tables is performed using a binary tree.

14. The method of claim 12, wherein the re-sorting of the CAVLC codeword length tables is so performed as to compare a codeword length last if the codeword length consisting of zero within the same column of the CAVLC length table is not a lowermost level of the binary tree.

15. The method of claim 12, wherein the re-sorting of the CAVLC codeword length tables is performed in such an order that a short codeword length is sorted first, namely, a codeword length having a high possibility of generation is sorted first.

16. The method of claim 11, wherein the reference column is a column selected from information included in a header part of a packet enclosing the bitstream and information of a decoded adjacent block.

17. The method of claim 11, wherein if the read bitstream value is zero, or if the bitstream value does not coincide with the value on the CAVLC value table as a result of the comparison, the bitstream is read as much as a codeword length that corresponds to a value next to a value compared in the reference column on the re-sorted table.

18. A CAVLC (context-based adaptive variable length coding) decoding apparatus for decoding a coded bitstream using (DAVLC length tables and CAVLC value tables, the apparatus comprising:
   a memory in which the CAVLC length tables and the CAVLC value tables are stored;
   a memory in which the CAVLC length tables are re-sorted in an order of a codeword length if the codeword length consisting of zero within the same column of the CAVLC length table is not a lowermost row of the CAVLC length table, and the CAVLC length tables are stored; and
   a CAVLC parser for receiving the bitstream to parse relevant variables using the re-sorted length tables, the CAVLC length tables, and the CAVLC value tables.

19. The apparatus of claim 18, further comprising a stream controller for delivering an inputted bitstream to the CAVLC parser according to a sorted order of the re-sorted table.

20. The apparatus of claim 18, wherein the re-sorted table is a table organized by re-sorting the CAVLC codeword length tables in an order of the codeword length.

21. The apparatus of claim 20, wherein the re-sorting of the CAVLC codeword length tables in the order of the codeword length is performed in such an order that a short codeword length is sorted first, namely, a codeword length having a high possibility of generation is sorted first.

22. A CAVLC (context-based adaptive variable length coding) decoding method for decoding a coded bitstream using CAVLC length tables and CAVLC value tables, the method comprising the steps of:
   re-sorting the CAVLC length tables in an order of a codeword length; and
   decoding the coded bitstream using the re-sorted length tables,
   wherein the step of re-sorting the CAVLC length tables uses a binary tree, and wherein the step of re-sorting is so performed as to compare a codeword length last if the codeword length consisting of zero within the same column of the CAVLC length table is not a lowermost level of the binary tree.

23. The method of claim 22, wherein the step of re-sorting comprises comparing a codeword length last if the codeword length consisting of zero within the same column of the CAVLC length table is not a lowermost level of the binary tree.

24. The method of claim 22, wherein the step of re-sorting comprises sorting a short codeword length having a high possibility of generation first.

25. The method of claim 22, wherein the step of decoding the coded bitstream comprises the steps of:
- selecting a table that corresponds to a variable desired to be decoded among the re-sorted tables;
- reading the bitstream as much as the codeword length sequentially starting from a first codeword length in a reference column within the selected table;
- comparing a value of the read bitstream with a value in the CAVLC value table, the value held by a codeword length that coincides with the read codeword length in a column that coincides with the reference column within the CAVLC length table; and
- storing a variable value if the value of the read bitstream coincides with the value in the CAVLC value table.

26. The method of claim 25, wherein the reference column is a column selected from information included in a header part of a packet enclosing the bitstream and information of a decoded adjacent block.

27. The method of claim 25, wherein if the read bitstream value is zero, the bitstream is read as much as a codeword length that corresponds to a value next to a value compared in the reference column on the re-sorted table.

28. The method of claim 27, wherein a process is terminated if a codeword value that corresponds to a codeword length for the next value is zero.

29. The method of claim 25, wherein if the bitstream value does not coincide with the value in the CAVLC value table, the bitstream is read as much as a codeword length that corresponds to a value next to a value compared in the reference column on the re-sorted table.

* * * * *